(12) United States Patent
Bi et al.

(10) Patent No.: US 11,221,532 B2
(45) Date of Patent: Jan. 11, 2022

(54) DISPLAY SUBSTRATE, METHOD OF MANUFACTURING THE SAME, DISPLAY PANEL AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yao Bi, Beijing (CN); Yu Zhao, Beijing (CN); Hongliang Yuan, Beijing (CN); Yanchen Li, Beijing (CN); Jian Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/758,801

(22) PCT Filed: Apr. 29, 2019

(86) PCT No.: PCT/CN2019/085007
§ 371 (c)(1),
(2) Date: Apr. 23, 2020

(87) PCT Pub. No.: WO2020/220201
PCT Pub. Date: Nov. 5, 2020

(65) Prior Publication Data
US 2021/0240044 A1   Aug. 5, 2021

(51) Int. Cl.
G02F 1/1368   (2006.01)
G02F 1/1362   (2006.01)

(52) U.S. Cl.
CPC ...... *G02F 1/136286* (2013.01); *G02F 1/1368* (2013.01); *G02F 1/136222* (2021.01)

(58) Field of Classification Search
CPC .................................................. H04L 65/1006
See application file for complete search history.

(56) References Cited

U.S. PATENT DOCUMENTS

| 6,433,841 B1 | 8/2002 | Murade et al. |
| 2008/0049176 A1* | 2/2008 | Kim ................. G02F 1/133555 349/114 |

(Continued)

FOREIGN PATENT DOCUMENTS

| CN | 101251696 A | 8/2008 |
| CN | 101430463 A | 5/2009 |

(Continued)

*Primary Examiner* — Sang V Nguyen
(74) *Attorney, Agent, or Firm* — McCoy Russell LLP

(57) ABSTRACT

A display substrate includes a base substrate, and a signal line and a pixel electrode arranged on the base substrate at different layers. The display substrate further includes a first transparent conductive pattern arranged between the pixel electrode and the signal line, a portion of the first transparent conductive pattern is arranged under the pixel electrode, a first passivation layer is arranged between the first transparent conductive pattern and the signal line, a second passivation layer is arranged between the first transparent conductive pattern and the pixel electrode, and the first transparent conductive pattern is electrically connected to a common electrode line of the display substrate.

13 Claims, 5 Drawing Sheets

(56) References Cited

U.S. PATENT DOCUMENTS

2010/0245698 A1* 9/2010 Kim .................. G02F 1/136209
  349/46
2014/0159086 A1 6/2014 Yu et al.
2017/0108731 A1* 4/2017 Dong ................ G02F 1/133345

FOREIGN PATENT DOCUMENTS

CN  103293797 A  9/2013
CN  103852941 A  6/2014
CN  104698706 A  6/2015

* cited by examiner

DISPLAY SUBSTRATE, METHOD OF MANUFACTURING THE SAME, DISPLAY PANEL AND DISPLAY DEVICE

CROSS-REFERENCE TO RELATED APPLICATIONS

The present application is the U.S. national phase of PCT Application No. PCT/CN2019/085007 filed on Apr. 29, 2019, which is incorporated herein by reference in its entirety.

TECHNICAL FIELD

The present disclosure relates to the field of display technology, in particular to a display substrate, a method of manufacturing the same, a display panel, and a display device.

BACKGROUND

Currently, transparent display devices have been more and more widely applied in such fields as intelligent home, wearable devices and vehicle-mounted devices, and an aperture ratio of each transparent display device is one of the key indicators. In a conventional transparent display device with Twisted Nematic (TN) mode, in order to increase the storage capacitance and shield leaking light, a light-shielding pattern is formed at a periphery of a pixel region with metal. In order to prevent the occurrence of the light leakage, usually the light-shielding pattern is provided with a relatively large area. However, the aperture ratio of the transparent display device may be adversely affected, i.e., the transparent display device may be provided with a relatively small aperture ratio.

SUMMARY

An object of the present disclosure is to provide a display substrate, a manufacturing method thereof, a display panel and a display device, so as to solve the above-mentioned problem.

In one aspect, the present disclosure provides in some embodiments a display substrate, including a base substrate, and a signal line and a pixel electrode arranged on the base substrate at different layers. The display substrate further includes a first transparent conductive pattern arranged between the pixel electrode and the signal line, a portion of the first transparent conductive pattern is arranged under the pixel electrode, a first passivation layer is arranged between the first transparent conductive pattern and the signal line, a second passivation layer is arranged between the first transparent conductive pattern and the pixel electrode, and the first transparent conductive pattern is electrically connected to a common electrode line of the display substrate.

In a possible embodiment of the present disclosure, the first transparent conductive pattern is arranged to cover the signal line.

In a possible embodiment of the present disclosure, the portion of the first transparent conductive pattern under the pixel electrode has a width not smaller than 1.5 µm.

In a possible embodiment of the present disclosure, the width is not greater than 1.75 µm.

In a possible embodiment of the present disclosure, the signal line includes a gate line and a data line.

In a possible embodiment of the present disclosure, the display substrate further includes: a thin film transistors (TFT) arranged on the base substrate; and a second transparent conductive pattern arranged between the pixel electrode and the TFT. A portion of the second transparent conductive pattern is arranged under the pixel electrode, and the second transparent conductive pattern is insulated from the pixel electrode and the TFT.

In a possible embodiment of the present disclosure, the second transparent conductive pattern is arranged on the TFT.

In a possible embodiment of the present disclosure, the second transparent conductive pattern is created from a same layer and made of a same material as the first transparent conductive pattern.

In another aspect, the present disclosure provides in some embodiments a display panel including the above-mentioned display substrate, a color film substrate arranged opposite to the display substrate to form a cell, and a liquid crystal layer arranged between the display substrate and the color film substrate. A common electrode is arranged on the color film substrate.

In a possible embodiment of the present disclosure, the common electrodes are made of a same material as the first transparent conductive pattern.

In yet another aspect, the present disclosure provides in some embodiments a display device including the above-mentioned display panel.

In still yet another aspect, the present disclosure provides in some embodiments a method of manufacturing a display substrate. The display substrate includes a base substrate, and a signal line and a pixel electrode arranged on the base substrate at different layers. The method includes forming a first transparent conductive pattern between the pixel electrode and the signal line. A portion of the first transparent conductive pattern is arranged under the pixel electrode, a first passivation layer is arranged between the first transparent conductive pattern and the signal line, a second passivation layer is arranged between the first transparent conductive pattern and the pixel electrode, and the first transparent conductive pattern is electrically connected to a common electrode line of the display substrate.

In a possible embodiment of the present disclosure, the method further includes: forming a TFT on the base substrate; and forming a second transparent conductive pattern between the pixel electrode and the TFT. A portion of the second transparent conductive pattern is arranged under the pixel electrode, and the second transparent conductive pattern is insulated from the pixel electrode and the TFT.

Figure 1:
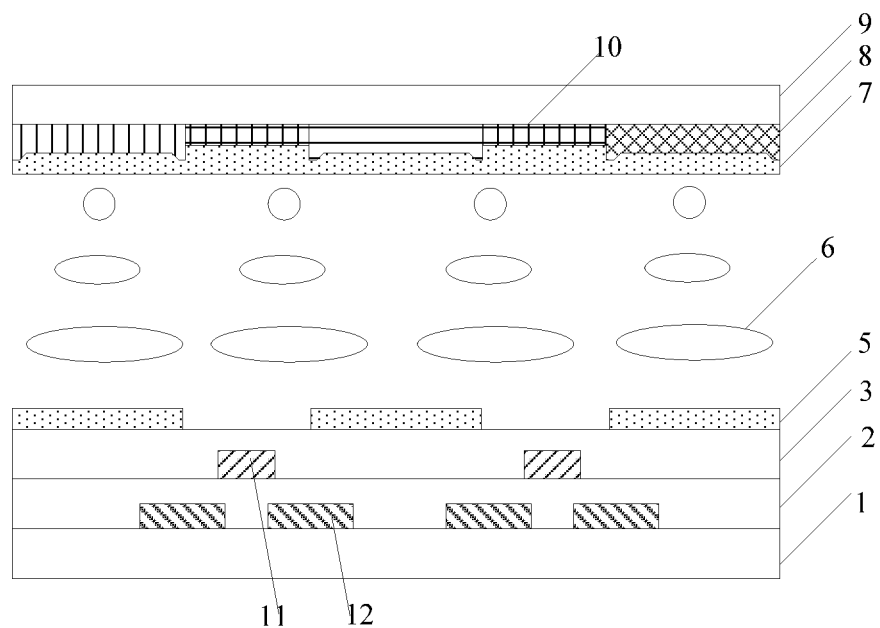
FIG. 1 is a schematic view showing a conventional liquid crystal display panel.

REFERENCE SIGN LIST 1 base substrate
2 gate insulation layer
3 first passivation layer
5 pixel electrode
6 liquid crystal layer
7 common electrode
8 color filter unit
9 base substrate
10 black matrix
11 data line
12 light-shielding pattern
13 second passivation layer
14 first transparent conductive pattern
15 gate line
26 second transparent conductive pattern
A light-shielding region
B light-transmitting region

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 2:
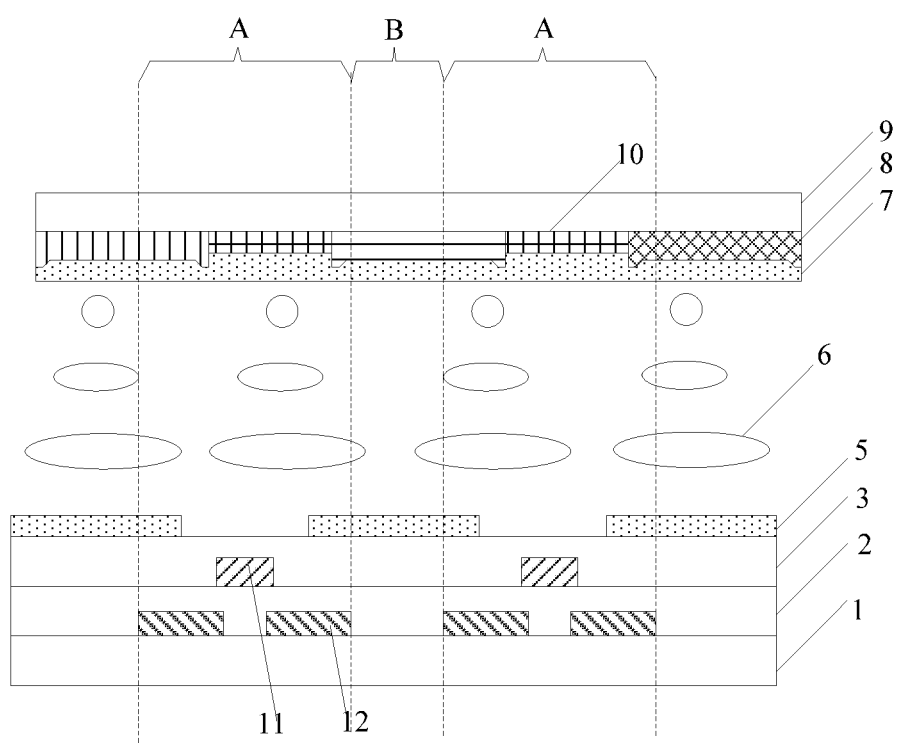
FIG. 2 is a schematic view showing a situation where misalignment occurs for the conventional liquid crystal display panel.
Figure 3:
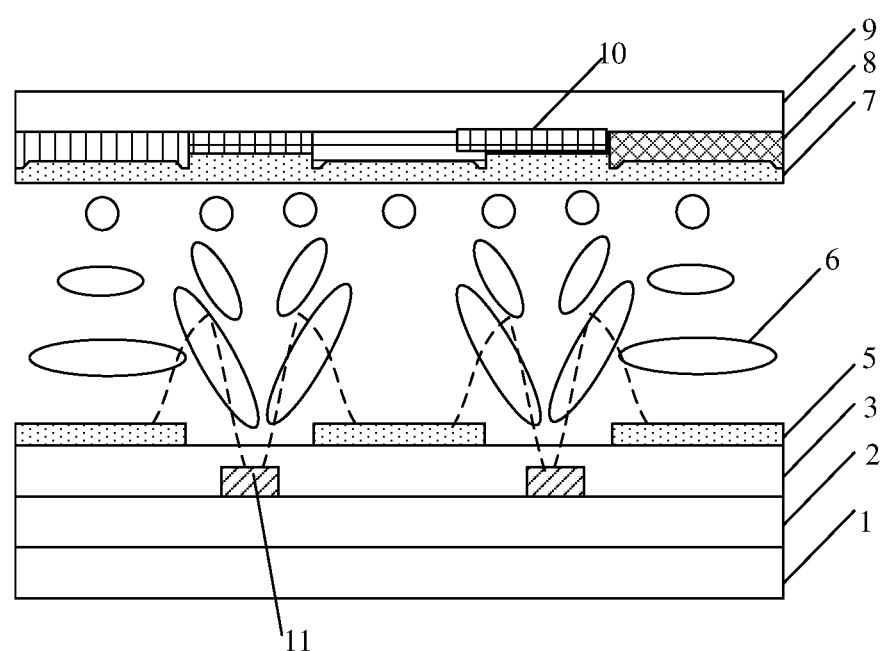
FIG. 3 is a schematic view showing a situation where dark-state leaking light when liquid crystals are deflected unexpectedly due to an electric field between pixel electrodes and signal lines in the related art.

Currently, transparent display devices have been more and more widely applied in such fields as intelligent home, wearable devices and vehicle-mounted devices, and an aperture ratio of each transparent display device is one of the key indicators. Usually, a conventional liquid crystal display panel merely has a transmittance of about 9%, so it cannot meet the market requirements. A liquid crystal display panel with a Polymer Network Liquid Crystal (PNLC) mode has a relatively large transmittance, and it is provided with a TN-mode pixel structure. As shown in FIG. 1, the liquid crystal display panel includes an array substrate and a color film substrate arranged opposite to each other. The color film substrate includes a base substrate 9, and a color filter unit 8, a black matrix 10 and a common electrode 7 arranged on the base substrate 9. The array substrate includes a gate insulation layer 2, a first passivation layer 3, a pixel electrode 5 and a data line 11 arranged on a base substrate 1. In addition, in order to increase the storage capacitance and shield leaking light, the liquid crystal display panel further includes a light-shielding pattern 12 made of a gate metal layer. The light-shielding pattern 12 is connected to a common electrode line, and during the operation of the liquid crystal display panel, a storage capacitor is capable of being formed between the light-shielding pattern and the pixel electrode 5. Furthermore, the light-shielding pattern 12 is also capable of shielding an electric field generated between the data line 11 and the pixel electrode 5, so as to prevent the occurrence of the light leakage due to liquid crystals in a disordered state. In order to increase the storage capacitance and shield the leaking light, usually the light-shielding pattern has a relatively large size, so an aperture ratio of the liquid crystal display panel may be adversely affected. As shown in FIG. 2, due to the limit of the alignment accuracy, when there is the misalignment between the color film substrate and the array substrate, the aperture ratio of the liquid crystal display panel may be further reduced due to the light-shielding pattern 12, so it is impossible to apply the liquid crystal display panel to transparent display, where A represents a light-shielding region, and B represents a light-transmitting region. As shown in FIG. 3, when the light-shielding pattern 12 is removed off from the liquid crystal display panel to increase the aperture ratio, such a phenomenon as flickering may occur due to a too small storage capacitance. In addition, it is impossible to shield the electric field between the data line 11 and the pixel electrode 5, so serious light leakage may occur. In FIG. 3, the dotted line represents the electric field between the data line 11 and the pixel electrode 5.

An object of the present disclosure is to provide a display substrate, a method of manufacturing the same, a display panel and a display device, so as to increase an aperture ratio of the display device.

The present disclosure provides in some embodiments a display substrate, which includes a base substrate, and signal lines and pixel electrodes arranged on the base substrate at different layers. The display substrate further includes a first transparent conductive pattern arranged between the pixel electrodes and the signal lines, a portion of the first transparent conductive pattern is arranged right under the pixel electrode, a first passivation layer is arranged between the first transparent conductive pattern and the signal lines, a second passivation layer is arranged between the first transparent conductive pattern and the pixel electrodes, and the first transparent conductive pattern is electrically connected to common electrode lines of the display substrate.

According to the embodiments of the present disclosure, the first transparent conductive pattern may be arranged between the pixel electrodes and the signal lines and electrically connected to the common electrode lines of the display substrate. A portion of the first transparent conductive pattern may be arranged right under the pixel electrode. During the operation of the display substrate, a storage capacitor may be formed between the first transparent conductive pattern and the pixel electrode, so as to increase a storage capacitance of the display device. In addition, the first transparent conductive pattern may shield the influence of an electric signal applied to each signal line on the pixel electrode, so as to prevent the occurrence of dark-state light leakage due to liquid crystals in a disordered state. In the embodiments of the present disclosure, the first transparent conductive pattern may be made of a transparent material, so as to allow light to pass through the display substrate, thereby to increase an aperture ratio of the display substrate and enable the display substrate to be applied to a transparent display device.

It should be appreciated that, in the embodiments of the present disclosure, the first transparent conductive pattern may not be electrically connected to the signal lines and the pixel electrodes through via-holes, and the first transparent conductive pattern may be insulated from the signal lines and the pixel electrodes.

When a portion of the first transparent conductive pattern is arranged right under the pixel electrode, it means that each pixel electrode may be arranged at a side of the first transparent conductive pattern away from the base substrate, and an orthogonal projection of the first transparent conductive pattern onto the base substrate may partially overlap an orthogonal projection of the pixel electrode onto the base substrate.

The display substrate in the embodiments of the present disclosure may be applied to a liquid crystal display panel and serve as an array substrate. To be specific, the first transparent conductive pattern may be made of a same transparent conductive material as the pixel electrodes of the display substrate, e.g., indium tin oxide (ITO). In this way, it is able to form a pixel electrode material layer and a material layer of the first transparent conductive pattern through a same film-forming device.

In a possible embodiment of the present disclosure, the first transparent conductive pattern may be arranged to cover the signal line. In this way, it is able for the first transparent conductive pattern to shield the influence of the electric signal applied to the signal line on the corresponding pixel electrode to the greatest extent, thereby to prevent the occurrence of the dark-state light leakage due to the liquid crystals in a disordered state. When the first transparent conductive pattern is arranged to cover the signal line, it means that the first transparent conductive pattern may be arranged at a side of the signal line away from the base substrate, and an orthogonal projection of the signal line onto the base substrate may fall within the orthogonal projection of the first transparent conductive pattern onto the base substrate.

In the embodiments of the present disclosure, a value of the added storage capacitance through the first transparent conductive pattern may depend on a width of a portion of the first transparent conductive pattern right under the pixel electrode in a direction perpendicular to an extension direction of the first transparent conductive pattern. In order to ensure the storage capacitance of the liquid crystal display panel and prevent the occurrence of flickering for an image, in a possible embodiment of the present disclosure, a width of the portion of the first transparent conductive pattern right under the pixel electrode may be not smaller than 1.5 µm. In addition, when the storage capacitance is too large, the pixel electrodes at an end may be charged insufficiently, so the width may not be greater than 1.75 µm to prevent the storage capacitance of the liquid crystal display panel from being too large.

The first transparent conductive pattern may be arranged between a first pixel electrode and a second pixel electrode adjacent to the first pixel electrode. The first transparent conductive pattern may include a first portion arranged right under the first pixel electrode and a second portion arranged right under the second pixel electrode. Each of the first portion and the second portion may have a width of 1.5 to 1.75 µm.

The signal lines may include gate lines and data lines. During the operation of the liquid crystal display panel, electric signals may be applied to the gate lines and the data lines, and the pixel electrodes may be adversely affected by the electric signals. On one hand, due to the electric field between the gate line or the data line and the pixel electrode, the liquid crystals may be in a disordered state, and on the other hand, an electric signal applied to each pixel electrode may be adversely affected. In the embodiments of the present disclosure, apart from between the data line and the pixel electrode, the first transparent conductive pattern may also be arranged between the gate line and the pixel electrode. In this way, it is able to not only prevent the electric signal applied to the data line on the pixel electrode, but also prevent the electric signal applied to the gate line on the pixel electrode.

The display substrate may further include TFTs arranged on the base substrate. During the operation of the liquid crystal display panel, an electric signal may also be applied to each TFT on the display substrate. In order to prevent the influence of the electric signal applied to each TFT on the pixel electrode, the display substrate may further include a second transparent conductive pattern arranged between the pixel electrodes and the TFTs, a portion of the second transparent conductive pattern may be arranged right under the pixel electrode, and the second transparent conductive pattern may be insulated from the pixel electrodes and the TFTs. In this way, a storage capacitor may be formed between the second transparent conductive pattern and the pixel electrode, so as to further increase the storage capacitance of the display device. In the embodiments of the present disclosure, the second transparent conductive pattern may be made of a transparent material, so as to allow light to pass through the display substrate, thereby to prevent the aperture ratio of the display substrate from being adversely affected. When a portion of the second transparent conductive pattern is arranged right under each pixel electrode, it means that each pixel electrode may be arranged at a side of the second transparent conductive pattern away from the base substrate, and an orthogonal projection of the second transparent conductive pattern onto the base substrate may partially overlap the orthogonal projection of the pixel electrode onto the base substrate.

In a possible embodiment of the present disclosure, the second transparent conductive pattern may be arranged on each TFT, so as to prevent the influence of the electric signal applied to each TFT on the corresponding pixel electrode to the greatest extent, thereby to prevent the occurrence of the dark-state light leakage due to the liquid crystals in a disordered state. When the second transparent conductive pattern is arranged on each TFT, it means that the second transparent conductive pattern is arranged at a side of each TFT away from the base substrate, and an orthogonal projection of each TFT onto the base substrate may fall within the orthogonal projection of the second transparent conductive pattern onto the base substrate.

In a possible embodiment of the present disclosure, the second transparent conductive pattern may be created from a same layer and made of a same material as the first transparent conductive pattern, so the first and second transparent conductive patterns may be formed through a single patterning process rather than two patterning processes. In this way, it is able to reduce the quantity of the patterning processes for manufacturing the display substrate, thereby to reduce the manufacture cost of the display substrate.

Figure 4:
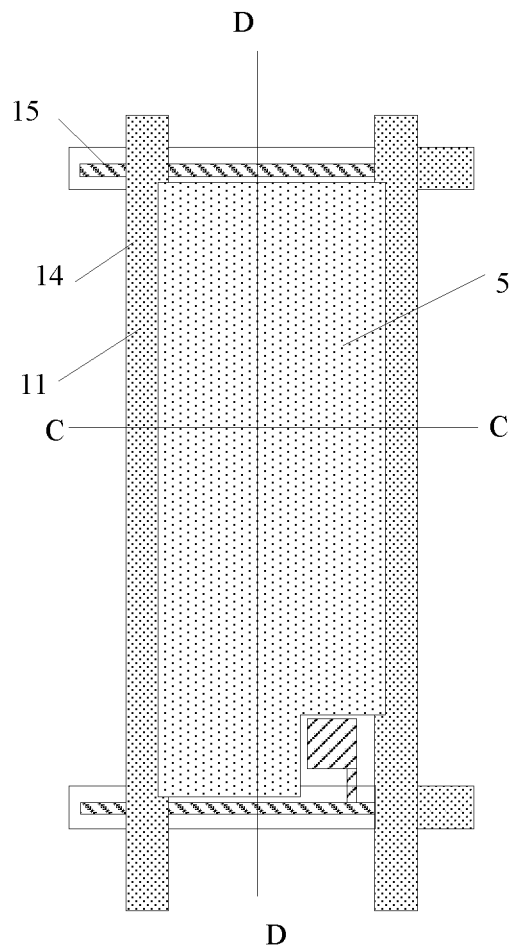
FIG. 4 is a planar view of a liquid crystal display panel according to one embodiment of the present disclosure.
Figure 5:
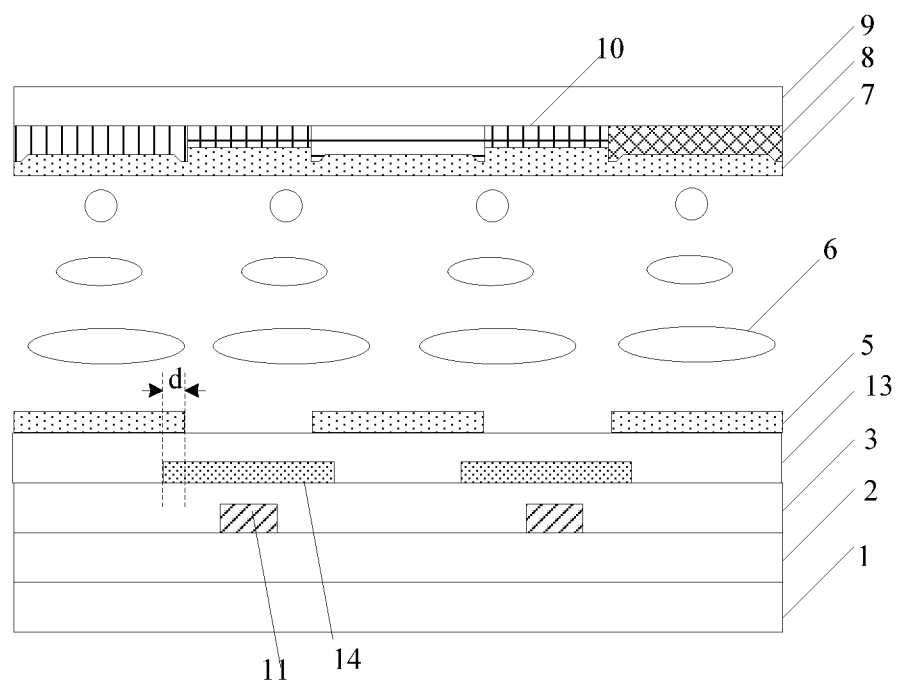
FIG. 5 is a sectional view of the liquid crystal display panel along line CC in FIG. 4.
Figure 6:
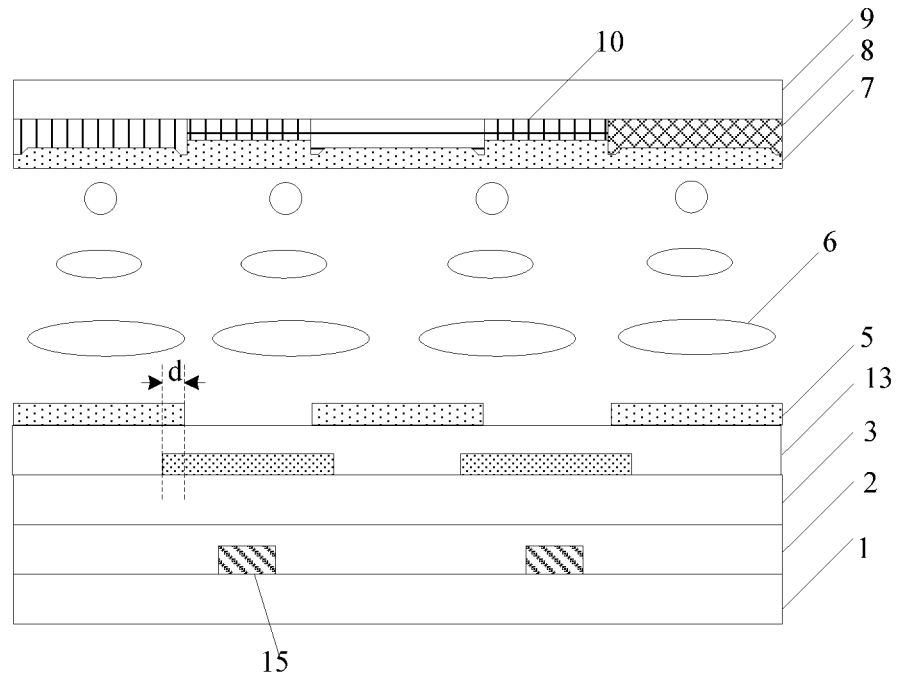
FIG. 6 is a sectional view of the liquid crystal display panel along line DD in FIG. 4.

To be specific, as shown in FIGS. 4-6, the display substrate may include: a base substrate 1; a gate line 15 arranged on the base substrate, a common electrode line and a gate electrode of a TFT arranged on the base substrate; a gate insulation layer 2 covering the gate line 15, the common electrode line and the gate electrode; a data line 11 and an active layer, a source electrode and a drain electrode of the TFT arranged at a side of the gate insulation layer 2 away from the gate line 15; a first passivation layer 3 covering the data line 11, the active layer, the source electrode and the drain electrode; a first transparent conductive pattern 14 arranged at a side of the first passivation layer 3 away from the data line 11; a second passivation layer 13 covering the first transparent conductive pattern 14; and a pixel electrode 5 arranged at a side of the second passivation layer 13 away from the first transparent conductive pattern 14.

In the embodiments of the present disclosure, as compared with a conventional liquid crystal display panel, a light-shielding pattern made of a gate metal layer is removed, the first transparent conductive pattern 14 and the second passivation layer 13 may be added between the pixel electrode 5 and the gate line 15 as well as the data line 11. The first transparent conductive pattern 14 may be electrically connected to the common electrode line, and a portion of the first transparent conductive pattern 14 may overlap the pixel electrode 5. As shown in FIGS. 5 and 6, d represents a width of the portion in a direction perpendicular to an extension of the first transparent conductive pattern. During the operation of the liquid crystal display panel, a common voltage signal may be applied to the first transparent conductive pattern 14, so as to form a storage capacitor between the first transparent conductive pattern 14 and the pixel electrode 5, thereby to increase the storage capacitance of the display substrate to a sufficient extent. In addition, the first transparent conductive pattern 14 may cover and shield the gate line 15 and the data line 11, so as to, on one hand, prevent the electric field from being generated between the pixel electrode 5 and the gate line 15 as well as the data line 11, and on the other hand, prevent an electric signal applied to the pixel electrode from being adversely affected by the gate line 15 and the data line 11, thereby to prevent the occurrence of light leakage due to the liquid crystals in a disordered state.

As shown in FIG. 5, two adjacent pixel electrodes 5 may be arranged on the first transparent conductive pattern 14, and the first transparent conductive pattern 14 may include a first portion arranged right under one pixel electrode 5 and a second portion right under the other pixel electrode 5. Each of the first portion and the second portion may have a width of d, and a value of the storage capacitance added through the first transparent pattern may depend on a value of d. In order to ensure the storage capacitance of the liquid crystal display panel and prevent the occurrence of flickering for an image, d may not be smaller than 1.5 µm. In addition, when the storage capacitance is too large, the pixel electrodes at an end may be charged insufficiently, so the width may not be greater than 1.75 µm to prevent the storage capacitance of the liquid crystal display panel from being too large.

Figure 7:
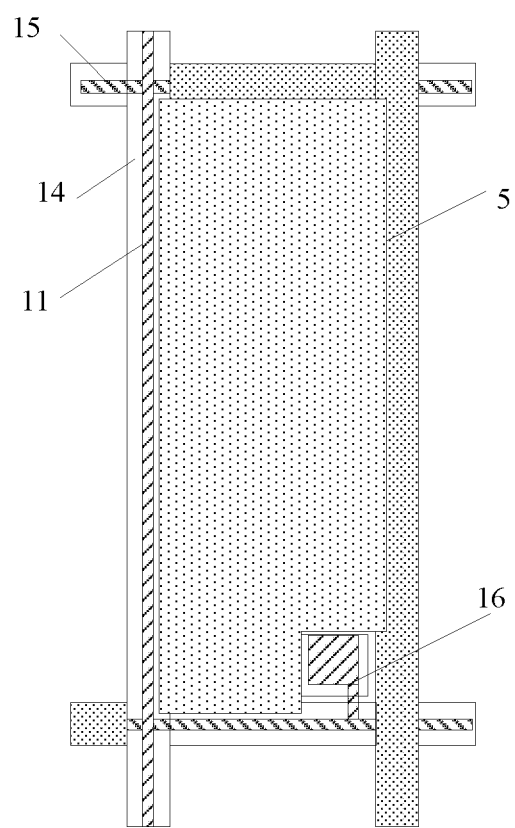
FIG. 7 is another planar view of the liquid crystal display panel according to one embodiment of the present disclosure.

As shown in FIG. 7, the second transparent conductive pattern 16 may be further arranged on each TFT of the display substrate, and between the pixel electrode 5 and the TFT, so as to prevent the influence of the electric signal applied to each TFT on the pixel electrode 5. An orthogonal projection of the second transparent conductive pattern 16 onto the base substrate may partially overlap an orthogonal projection of the pixel electrode 5 onto the base substrate 1. In this way, a storage capacitor may be further formed between the second transparent conductive pattern 16 and the pixel electrode 5, so as to further increase the storage capacitance of the display device. The second transparent conductive pattern 16 may be made of a transparent material, so as to allow light to pass through the display substrate, thereby to prevent the aperture ratio of the display substrate from being adversely affected.

According to the embodiments of the present disclosure, it is able to increase the aperture ratio of the display substrate by more than 40%, thereby to significantly improve a display effect of the display substrate and apply the display substrate to a transparent display scenario.

The present disclosure further provides in some embodiments a display panel, which includes the above-mentioned display substrate, a color film substrate arranged opposite to the display substrate to form a cell, and a liquid crystal layer arranged between the display substrate and the color film substrate. Common electrodes are arranged on the color film substrate.

In a possible embodiment of the present disclosure, the common electrodes may be made of a same material as the first transparent conductive pattern, e.g., ITO. In this way, it is able to form a material layer of the common electrodes and a material layer of the first transparent conductive pattern through a same film-forming device.

In the embodiments of the present disclosure, during the operation of the display panel, electric signals having a same voltage, e.g., 0V, may be applied to the first transparent conductive pattern and the common electrodes.

When the display substrate further includes the second transparent conductive pattern between the pixel electrodes and the TFTs, during the operation of the display panel, electric signals having a same voltage may also be applied to the second transparent conductive pattern and the common electrodes.

The present disclosure further provides in some embodiments a display device including the above-mentioned display panel. The display device may include, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, flat-panel computer, television, wearable electronic device or navigator.

The present disclosure further provides in some embodiments a method of manufacturing a display substrate. The display substrate includes a base substrate, and signal lines and pixel electrodes arranged on the base substrate at different layers. The method includes forming a first transparent conductive pattern between the pixel electrodes and the signal lines. A portion of the first transparent conductive pattern may be arranged right under the pixel electrode, a first passivation layer may be arranged between the first transparent conductive pattern and the signal lines, a second passivation layer may be arranged between the first transparent conductive pattern and the pixel electrodes, and the first transparent conductive pattern may be electrically connected to common electrode lines of the display substrate.

According to the embodiments of the present disclosure, the first transparent conductive pattern may be arranged between the pixel electrodes and the signal lines and electrically connected to the common electrode lines of the display substrate. A portion of the first transparent conductive pattern may be arranged right under the pixel electrode. During the operation of the display substrate, a storage capacitor may be formed between the first transparent conductive pattern and the pixel electrode, so as to increase a storage capacitance of the display device. In addition, the first transparent conductive pattern may shield the influence of an electric signal applied to the signal line on the corresponding pixel electrode, so as to prevent the occurrence of dark-state light leakage due to liquid crystals in a disordered state. In the embodiments of the present disclosure, the first transparent conductive pattern may be made of a transparent material, so as to allow light to pass through the display substrate, thereby to increase an aperture ratio of the display substrate and enable the display substrate to be applied to a transparent display device.

It should be appreciated that, in the embodiments of the present disclosure, the first transparent conductive pattern may not be electrically connected to the signal lines and the pixel electrodes through via-holes, and the first transparent conductive pattern may be insulated from the signal lines and the pixel electrodes.

When a portion of the first transparent conductive pattern is arranged right under the pixel electrode, it means that the pixel electrode may be arranged at a side of the first transparent conductive pattern away from the base substrate, and an orthogonal projection of the first transparent conductive pattern onto the base substrate may partially overlap an orthogonal projection of each pixel electrode onto the base substrate.

The display substrate in the embodiments of the present disclosure may be applied to a liquid crystal display panel and serve as an array substrate. To be specific, the first transparent conductive pattern may be made of a same transparent conductive material as the pixel electrodes of the display substrate, e.g., ITO. In this way, it is able to form a pixel electrode material layer and a material layer of the first transparent conductive pattern through a same film-forming device.

In a possible embodiment of the present disclosure, the first transparent conductive pattern may be arranged to cover the signal line. In this way, it is able for the first transparent conductive pattern to shield the influence of the electric signal applied to the signal line on the pixel electrode to the greatest extent, thereby to prevent the occurrence of the dark-state light leakage due to the liquid crystals in a disordered state. When the first transparent conductive pattern is arranged on the signal line, it means that the first transparent conductive pattern may be arranged at a side of the signal line away from the base substrate, and an orthogonal projection of each signal line onto the base substrate may fall within the orthogonal projection of the first transparent conductive pattern onto the base substrate.

In the embodiments of the present disclosure, a value of the added storage capacitance through the first transparent conductive pattern may depend on a width of the portion of the first transparent conductive pattern right under each pixel electrode. In order to ensure the storage capacitance of the liquid crystal display panel and prevent the occurrence of flickering for an image, in a possible embodiment of the present disclosure, a width of the portion of the first transparent conductive pattern under the pixel electrode may be not smaller than 1.5 μm. In addition, when the storage capacitance is too large, the pixel electrodes at an end may be charged insufficiently, so the width may not be greater than 1.75 μm to prevent the storage capacitance of the liquid crystal display panel from being too large.

The first transparent conductive pattern may be arranged between a first pixel electrode and a second pixel electrode adjacent to the first pixel electrode. The first transparent conductive pattern may include a first portion arranged right under the first pixel electrode and a second portion arranged right under the second pixel electrode. Each of the first portion and the second portion may have a width of 1.5 to 1.75 μm.

The signal lines may include gate lines and data lines. During the operation of the liquid crystal display panel, electric signals may be applied to the gate lines and the data lines, and the pixel electrodes may be adversely affected by the electric signals. On one hand, due to the electric field between the gate line or the data line and the pixel electrode, the liquid crystals may be in a disordered state, and on the other hand, an electric signal applied to the pixel electrode may be adversely affected. In the embodiments of the present disclosure, apart from between the data line and the pixel electrode, the first transparent conductive pattern may also be arranged between the gate line and the pixel electrode. In this way, it is able to not only prevent the electric signal applied to the data line on the pixel electrode, but also prevent the electric signal applied to the gate line on the pixel electrode.

The display substrate may further include TFTs arranged on the base substrate. During the operation of the liquid crystal display panel, an electric signal may also be applied to the TFT on the display substrate. In order to prevent the influence of the electric signal applied to the TFT on the corresponding pixel electrode, the method may further include forming a second transparent conductive pattern between the pixel electrodes and the TFTs. A portion of the second transparent conductive pattern may be arranged right under the pixel electrode, and the second transparent conductive pattern may be insulated from the pixel electrodes and the TFTs. In this way, a storage capacitor may be formed between the second transparent conductive pattern and the pixel electrode, so as to further increase the storage capacitance of the display device. In the embodiments of the present disclosure, the second transparent conductive pattern may be made of a transparent material, so as to allow light to pass through the display substrate, thereby to prevent the aperture ratio of the display substrate from being adversely affected. When a portion of the second transparent conductive pattern is arranged under the pixel electrode, it means that the pixel electrode may be arranged at a side of the second transparent conductive pattern away from the base substrate, and an orthogonal projection of the second transparent conductive pattern onto the base substrate may partially overlap the orthogonal projection of each pixel electrode onto the base substrate.

In a possible embodiment of the present disclosure, the second transparent conductive pattern may be arranged on each TFT, so as to prevent the influence of the electric signal applied to each TFT on the corresponding pixel electrode to the greatest extent, thereby to prevent the occurrence of the dark-state light leakage due to the liquid crystals in a disordered state. When the second transparent conductive pattern is arranged on each TFT, it means that the second transparent conductive pattern is arranged at a side of the TFT away from the base substrate, and an orthogonal projection of the TFT onto the base substrate may fall within the orthogonal projection of the second transparent conductive pattern onto the base substrate.

In a possible embodiment of the present disclosure, the second transparent conductive pattern may be created from a same layer and made of a same material as the first transparent conductive pattern, so the first and second transparent conductive patterns may be formed through a single patterning process rather than two patterning processes. In this way, it is able to reduce the quantity of the patterning processes for manufacturing the display substrate, thereby to reduce the manufacture cost of the display substrate.

In a specific embodiment of the present disclosure, the method of manufacturing the display substrate may include the following steps.

Step 1: providing the base substrate 1 and forming a gate metal layer pattern on the base substrate. The base substrate 1 may be a glass substrate or a quartz substrate. To be specific, the gate metal layer having a thickness of about 500 to 4000 Å may be deposited onto the base substrate 1 through sputtering or thermal evaporation. The gate metal layer may be made of Cu, Al, Ag, Mo, Cr, Nd, Ni, Mn, Ti, Ta or W, or an alloy thereof, and it may be of a single-layered structure, or a multi-layered structure such as Cu/Mo, Ti/Cu/Ti or Mo/Al/Mo. Next, a photoresist may be applied onto the gate metal layer, and exposed with a mask plate, so as to form a photoresist reserved region corresponding a region where patterns of the gate lines and the gate electrode are located and a photoresist unreserved region corresponding to the other region. Next, the photoresist may be developed, so as to fully remove the photoresist at the photoresist unreserved region and maintain a thickness of the photoresist at the photoresist reserved region. Then, a gate metal thin film at the photoresist unreserved region may be etched off through an etching process, and the remaining photoresist may be removed, so as to form the gate line 15 and the gate electrode of the TFT.

Step 2: forming the gate insulation layer 2 on the substrate acquired after Step 1. To be specific, the gate insulation layer having a thickness of 500 to 5000 Å may be deposited onto the substrate acquired after Step 1 through Plasma Enhanced Chemical Vapor Deposition (PECVD). The gate insulation layer may be made of an oxide, a nitride or an oxynitride, with a corresponding reactive gas as ($SiH_4$, $NH_3$ or $N_2$), or ($SiH_2Cl_2$, $NH_3$ or $N_2$).

Step 3: forming an active layer pattern on the substrate acquired after Step 2. To be specific, a semiconductor material layer may be deposited on the substrate. Next, a photoresist may be applied onto the semiconductor material layer, and exposed with a mask plate, so as to form a photoresist reserved region corresponding to a region where the pattern of the active layer is located and a photoresist unreserved region corresponding to the other region. Next, the photoresist may be developed, so as to fully remove the photoresist at the photoresist unreserved region and maintain a thickness of the photoresist at the photoresist reserved region. Then, the semiconductor material layer at the photoresist unreserved region may be etched off through an etching process, and the remaining photoresist may be removed, so as to form the pattern of the active layer.

Step 4: forming a source-drain metal layer pattern on the substrate acquired after Step 3. To be specific, the source-drain metal layer having a thickness of about 2000 to 4000 Å may be deposited onto the substrate acquired after Step 3 through magnetron sputtering, thermal evaporation or any other film-forming process. The source-drain metal layer may be made of Cu, Al, Ag, Mo, Cr, Nd, Ni, Mn, Ti, Ta or W, or an alloy thereof, and it may be of a single-layered structure, or a multi-layered structure such as Cu/Mo, Ti/Cu/Ti or Mo/Al/Mo. Next, a photoresist may be applied onto the source-drain metal layer, and exposed with a mask plate, so as to form a photoresist reserved region corresponding to a region where patterns of the source electrode, the drain electrode and the data line are located and a photoresist unreserved region corresponding to the other region. Next, the photoresist may be developed, so as to fully remove the photoresist at the photoresist unreserved region and maintain a thickness of the photoresist at the photoresist reserved region. Then, the source-drain metal layer at the photoresist unreserved region may be etched off through an etching process, and the remaining photoresist may be removed, so as to form the drain electrode and the source electrode of the TFT, and the data line 11.

Step 5: forming the first passivation layer 3 on the substrate acquired after Step 4. To be specific, the first passivation layer having a thickness of 2000 to 4000 Å may be deposited onto the substrate acquired after Step 4 through magnetron sputtering, thermal evaporation, PECVD or any other film-forming process. The first passivation layer may be made of an oxide, an nitride or an oxynitride. To be specific, the first passivation layer may be made of SiNx, SiOx, Si(ON)x or $Al_2O_3$. The first passivation layer may be of a single-layered structure, or a double-layered structure consisting of a SiNx layer and a SiOx layer. A reactive gas corresponding to the oxide may be $SiH_4$ or $N_2O$, and a reactive gas corresponding to the nitride or the oxynitride may be ($SiH_4$, $NH_3$ or $N_2$), or ($SiH_2Cl_2$, $NH_3$ or $N_2$).

Step 6: forming the first transparent conductive pattern 14 and the second transparent conductive pattern 16 on the substrate acquired after Step 5. To be specific, a transparent conductive layer having a thickness of about 300 to 1500 Å may be deposited onto the substrate acquired after Step 5 through sputtering or thermal evaporation. The transparent conductive layer may be made of ITO, indium zinc oxide (IZO) or any other transparent metal oxide. Next, a photoresist may be applied onto the transparent conductive layer, and exposed with a mask plate, so as to form a photoresist reserved region corresponding to a region where the first transparent conductive pattern 14 and the second transparent conductive pattern 16 are located, and a photoresist unreserved region corresponding to the other region. Next, the photoresist may be developed, so as to fully remove the photoresist at the photoresist unreserved region and maintain a thickness of the photoresist at the photoresist reserved region. Then, a transparent conductive layer thin film at the photoresist unreserved region may be etched off through an etching process, and the remaining photoresist may be removed, so as to form the first transparent conductive pattern 14 and the second transparent conductive pattern 16. As shown in FIGS. 4-7, an orthogonal projection of the first transparent conductive pattern 14 onto the base substrate 1 may completely cover an orthogonal projection of the gates lines and the data lines onto the base substrate 1. An orthogonal projection of the second transparent conductive pattern 16 onto the base substrate 1 may completely cover an orthogonal projection of the TFTs onto the base substrate 1.

Step 7: forming the second passivation layer 13 on the substrate acquired after Step 6. To be specific, the second passivation layer having a thickness of 2000 to 4000 Å may be deposited onto the substrate acquired after Step 6 through magnetron sputtering, thermal evaporation, PECVD or any other film-forming process. The second passivation layer may be made of an oxide, a nitride or an oxynitride. To be specific, the second passivation layer may be made of SiNx, SiOx, Si(ON)x or $Al_2O_3$. The second passivation layer may be of a single-layered structure, or a double-layered structure consisting of a SiNx layer and a SiOx layer. A reactive gas corresponding to the oxide may be $SiH_4$ or $N_2O$, and a reactive gas corresponding to the nitride or the oxynitride may be ($SiH_4$, $NH_3$ or $N_2$), or ($SiH_2Cl_2$, $NH_3$ or $N_2$).

Step 8: forming the pixel electrode 5 on the substrate acquired after Step 7. To be specific, a transparent conductive layer having a thickness of about 300 to 1500 Å may be deposited onto the substrate acquired after Step 7 through sputtering or thermal evaporation. The transparent conductive layer may be made of ITO, IZO or any other transparent metal oxide. Next, a photoresist may be applied onto the transparent conductive layer, and exposed with a mask plate, so as to form a photoresist reserved region corresponding to a region where the pixel electrode 5 is located, and a photoresist unreserved region corresponding to the other region. Next, the photoresist may be developed, so as to fully remove the photoresist at the photoresist unreserved region and maintain a thickness of the photoresist at the photoresist reserved region. Then, a transparent conductive layer thin film at the photoresist unreserved region may be etched off through an etching process, and the remaining photoresist may be removed, so as to form the pixel electrode 5.

The display substrate in the embodiments of the present disclosure may be manufactured through the above steps. In the embodiments of the present disclosure, as compared with a conventional liquid crystal display panel, a light-shielding pattern made of a gate metal layer is removed, the first transparent conductive pattern 14 and the second passivation layer 13 may be added between the pixel electrode 5 and the gate line 15 as well as the data line 11. The first transparent conductive pattern 14 may be electrically connected to the common electrode line, and a portion of the first transparent conductive pattern 14 may overlap the pixel electrode 5, where d represents a width of the portion in a direction perpendicular to an extension of the first transparent conductive pattern. During the operation of the liquid crystal display panel, a common voltage signal may be applied to the first transparent conductive pattern 14, so as to form a storage capacitor between the first transparent conductive pattern 14 and the pixel electrode 5, thereby to increase the storage capacitance of the display substrate to a sufficient extent. In addition, the first transparent conductive pattern 14 may cover and shield the gate line 15 and the data line 11, so as to, on one hand, prevent the electric field from being generated between the pixel electrode 5 and the gate line 15 as well as the data line 11, and on the other hand, prevent an electric signal applied to the pixel electrode from being adversely affected by the gate line 15 and the data line 11, thereby to prevent the occurrence of light leakage due to the liquid crystals in a disordered state.

As shown in FIG. 7, the second transparent conductive pattern 16 may be further arranged on the TFT of the display substrate, and between the pixel electrode 5 and the TFT, so as to prevent the influence of the electric signal applied to each TFT on the pixel electrode 5. An orthogonal projection of the second transparent conductive pattern 16 onto the base substrate 1 may partially overlap an orthogonal projection of the pixel electrode 5 onto the base substrate 1. In this way, a storage capacitor may be further formed between the second transparent conductive pattern 16 and the pixel electrode 5, so as to further increase the storage capacitance of the display device. The second transparent conductive pattern 16 may be made of a transparent material, so as to allow light to pass through the display substrate, thereby to prevent the aperture ratio of the display substrate from being adversely affected.

According to the embodiments of the present disclosure, it is able to increase the aperture ratio of the display substrate by more than 40%, thereby to significantly improve a display effect of the display substrate and apply the display substrate to a transparent display scenario.

In the embodiments of the present disclosure, the order of the steps is not limited to the serial numbers thereof. For a person skilled in the art, any change in the order of the steps shall also fall within the scope of the present disclosure without any creative effort.

It should be further appreciated that, the above embodiments have been described in a progressive manner, and the same or similar contents in the embodiments have not beam repeated, i.e., each embodiment has merely focus on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the embodiments of the present disclosure, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising a base substrate, and a signal line and a pixel electrode arranged on the base substrate at different layers, wherein the display substrate further comprises a first transparent conductive pattern arranged between the pixel electrode and the signal line, a portion of the first transparent conductive pattern is arranged under the pixel electrode, a first passivation layer is arranged between the first transparent conductive pattern and the signal line, a second passivation layer is arranged between the first transparent conductive pattern and the pixel electrode, and the first transparent conductive pattern is electrically connected to a common electrode line of the display substrate,
wherein the first transparent conductive pattern is arranged to cover the signal line.

2. The display substrate according to claim 1, wherein the portion of the first transparent conductive pattern under the pixel electrode has a width not smaller than 1.5 µm.

3. The display substrate according to claim 2, wherein the width of the portion of the first transparent conductive pattern under one pixel electrode is not greater than 1.75 µm.

4. The display substrate according to claim 1, wherein the signal line comprises a gate line and a data line.

5. The display substrate according to any one of claim 1, further comprising:
a thin film transistors (TFT) arranged on the base substrate; and
a second transparent conductive pattern arranged between the pixel electrode and the TFT, wherein a portion of the second transparent conductive pattern is arranged under the pixel electrode, and the second transparent conductive pattern is insulated from the pixel electrode and the TFT.

6. The display substrate according to claim 5, wherein the second transparent conductive pattern is arranged on the TFT.

7. The display substrate according to claim 5, wherein the second transparent conductive pattern is created from a same layer and made of a same material as the first transparent conductive pattern.

8. A display panel, comprising the display substrate according to claim 1, a color film substrate arranged opposite to the display substrate to form a cell, and a liquid crystal layer arranged between the display substrate and the color film substrate, wherein a common electrode is arranged on the color film substrate.

9. The display panel according to claim 8, wherein the common electrode are made of a same material as the first transparent conductive pattern.

10. A display device, comprising the display panel according to claim 8.

11. A method of manufacturing a display substrate, the display substrate comprising a base substrate, and a signal line and a pixel electrode arranged on the base substrate at different layers, the method comprising:

forming a first transparent conductive pattern between the pixel electrode and the signal line, wherein a portion of the first transparent conductive pattern is arranged under the pixel electrode, a first passivation layer is arranged between the first transparent conductive pattern and the signal line, a second passivation layer is arranged between the first transparent conductive pattern and the pixel electrode, and the first transparent conductive pattern is electrically connected to a common electrode line of the display substrate.

12. The method according to claim 11, further comprising:

forming a TFT on the base substrate; and forming a second transparent conductive pattern between the pixel electrode and the TFT, wherein a portion of the second transparent conductive pattern is arranged under the pixel electrode, and the second transparent conductive pattern is insulated from the pixel electrode and the TFT.

13. A display device, comprising the display panel according to claim 9.

* * * * *